(12) United States Patent
Song et al.

(10) Patent No.: US 10,278,314 B2
(45) Date of Patent: Apr. 30, 2019

(54) SOFT AND/OR FLEXIBLE EMI SHIELDS AND RELATED METHODS

(71) Applicant: Laird Technologies, Inc., Earth City, MO (US)

(72) Inventors: John Song, Barrington, IL (US); Gerald R. English, Glen Ellyn, IL (US); Mohammadali Khorrami, Foxboro, MA (US); Paul Francis Dixon, Sharon, MA (US)

(73) Assignee: LAIRD TECHNOLOGIES, INC., Chesterfield, MO (US)

( * ) Notice: Subject to any disclaimer, the term of this patent is extended or adjusted under 35 U.S.C. 154(b) by 0 days.

(21) Appl. No.: 15/869,961

(22) Filed: Jan. 12, 2018

(65) Prior Publication Data

US 2018/0139872 A1    May 17, 2018

Related U.S. Application Data

(63) Continuation of application No. PCT/US2016/044203, filed on Jul. 27, 2016.

(60) Provisional application No. 62/199,087, filed on Jul. 30, 2015, provisional application No. 62/326,933, filed on Apr. 25, 2016.

(51) Int. Cl.
    *H05K 9/00* (2006.01)

(52) U.S. Cl.
    CPC ........... *H05K 9/003* (2013.01); *H05K 9/0026* (2013.01); *H05K 9/0043* (2013.01)

(58) Field of Classification Search
    None
    See application file for complete search history.

(56) References Cited

U.S. PATENT DOCUMENTS

| | | | | |
|---|---|---|---|---|
| 3,612,744 A | * | 10/1971 | Thomas | H01B 7/0838 174/117 FF |
| 4,385,279 A | * | 5/1983 | Meador | H03H 5/02 333/202 |
| 4,714,905 A | * | 12/1987 | Bernstein | H03H 1/00 29/832 |
| 5,748,455 A | | 5/1998 | Phillips et al. | |

(Continued)

FOREIGN PATENT DOCUMENTS

| | | |
|---|---|---|
| JP | 2004311499 A | 11/2004 |
| WO | WO-0199483 A1 | 12/2001 |

OTHER PUBLICATIONS

International Search Report and Written Opinion for PCT Application No. PCT/US2016/044203 filed Jul. 27, 2016 (published as WO 2017/019738 on Feb. 2, 2017) which claims priority to the same parent application as the instant application, dated Oct. 21, 2016, 11 pages.

*Primary Examiner* — Binh B Tran
*Assistant Examiner* — Douglas R Burtner
(74) *Attorney, Agent, or Firm* — Harness, Dickey & Pierce, P.L.C.; Anthony G. Fussner

(57) ABSTRACT

According to various aspects, exemplary embodiments are disclosed of soft and/or flexible electromagnetic interference (EMI) shields. In an exemplary embodiment, a shield is suitable for use in providing EMI shielding for one or more components on a substrate. The shield generally includes one or more contacts configured for installation on the substrate and an electrically-conductive cover configured for installation on the contact(s).

19 Claims, 5 Drawing Sheets

(56) References Cited

U.S. PATENT DOCUMENTS

| | | | |
|---|---|---|---|
| 6,075,713 A * | 6/2000 | Lee | H01G 4/255 333/184 |
| 6,885,275 B1 * | 4/2005 | Chang | H01F 17/0006 257/531 |
| 8,742,272 B2 | 6/2014 | English et al. | |
| 9,105,899 B2 * | 8/2015 | Pakula | H01M 2/1022 |
| 2001/0041548 A1 * | 11/2001 | Bult | H03F 3/195 455/252.1 |
| 2007/0188384 A1 * | 8/2007 | Liu | H01Q 1/526 343/700 MS |
| 2008/0080160 A1 | 4/2008 | English et al. | |
| 2011/0147062 A1 * | 6/2011 | Stevenson | H01G 4/35 174/260 |
| 2013/0027897 A1 * | 1/2013 | Just | H05K 1/0218 361/764 |
| 2014/0071635 A1 * | 3/2014 | Werner | H05K 3/30 361/748 |
| 2014/0167858 A1 * | 6/2014 | van Zuijlen | H01L 23/66 330/295 |
| 2015/0199045 A1 * | 7/2015 | Robucci | G06F 3/044 345/174 |
| 2016/0154952 A1 * | 6/2016 | Venkatraman | H04L 63/0861 705/44 |
| 2016/0261039 A1 * | 9/2016 | Parsche | H01Q 1/526 |

\* cited by examiner

SOFT AND/OR FLEXIBLE EMI SHIELDS AND RELATED METHODS

CROSS-REFERENCE TO RELATED APPLICATIONS

This application is a U. S. Continuation of PCT International Application No. PCT/US2016/044203 filed Jul. 27, 2016 (published as WO 2017/019738 on Feb. 2, 2017), which, in turn, claims priority to and the benefit of U.S. Provisional Patent Application No. 62/199,087 filed Jul. 30, 2015 and U.S. Provisional Patent Application No. 62/326, 933 filed Apr. 25, 2016. The entire disclosures of the above applications are incorporated herein by reference.

FIELD

The present disclosure generally relates to soft and/or flexible electromagnetic interference (EMI) shields, such as soft and/or flexible board level shields.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

DETAILED DESCRIPTION

Figure 1:
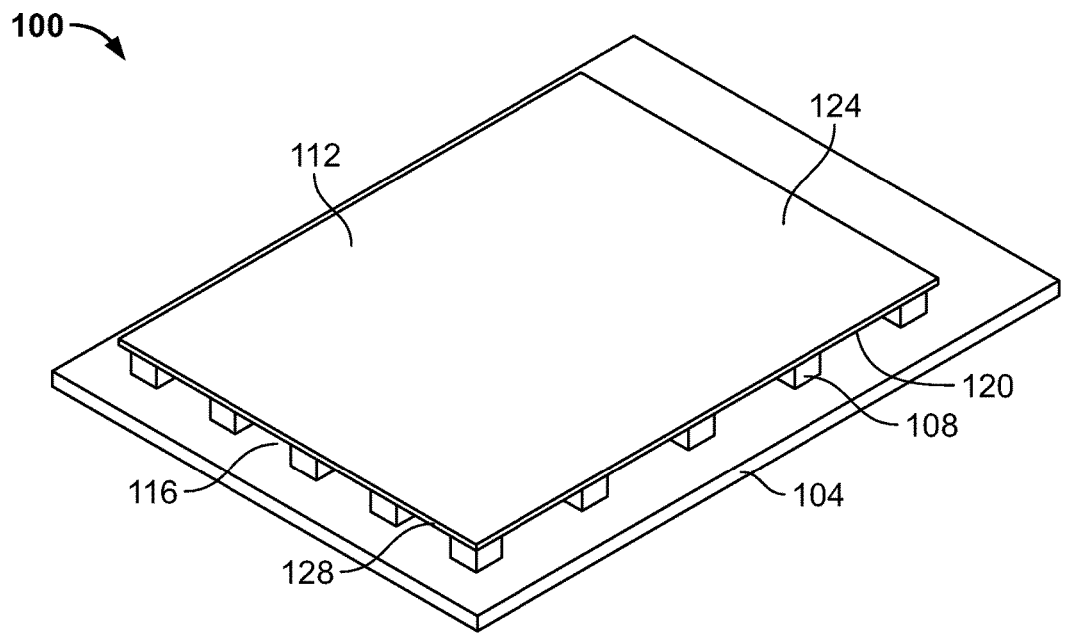
FIG. 1 is a perspective view of a soft and/or flexible board level shield according to an exemplary embodiment.

Example embodiments will now be described more fully with reference to the accompanying drawings.

Disclosed herein are exemplary embodiments of soft and/or flexible electromagnetic (EMI) shields, shielding material, shielding apparatus, or assemblies. In various exemplary embodiments, an EMI shield includes one or more contacts and an electrically-conductive cover or lid (broadly, a top or upper surface). The contacts are configured for installation on or to a substrate. The cover is configured for installation on the one or more contacts. In some embodiments, the cover may also include one or more sidewalls. In some embodiments, the contacts may comprise one or more L-C resonators that are configured to resonate at a resonant frequency and that are operable for virtually connecting to a ground plane, e.g., without using grounding vias or electrically-conductive grounding contacts, etc. Each L-C resonator may include an inductor and a capacitor.

In exemplary embodiments, the shield's cover may be soft and/or flexible. For example, the shield's cover may be configured with sufficient flexibility such that the shield's cover is capable of being flexed, bent, or curved to a radius of curvature of 100 millimeters (mm). Additionally, or alternatively, the shield's cover may be configured to have a predetermined elongation percentage, force versus deflection profile or characteristics, bend radius, softness, etc.

Some exemplary embodiments may include contacts that are soft and/or flexible. For example, the contacts may be configured with sufficient flexibility such that the shield's cover is capable of being flexed, bent, or curved to radius of curvature of 100 mm. Additionally, or alternatively, the contacts may be configured to have a predetermined elongation percentage, force versus deflection profile or characteristics, bend radius, softness, etc. Alternatively, the contacts may be rigid in other exemplary embodiments. The contacts are preferably sized to have a relatively small (e.g., minimum, etc.) footprint.

The cover may comprise or be formed from a wide range of materials. For example, exemplary embodiments may include a cover that comprises a dielectric material (e.g., plastic, polyimide, polyphenylene sulfide, polyethylene terephthalate, etc.) provided with an electrically-conductive layer thereon, such as a layer of tin or a metal layer provided by coating, metallizing, plating, sputtering, evaporation, adhesive, etc. Instead of having a single electrically-conductive layer thereon, the cover may be selectively plated, e.g., with metal, etc. in a predetermined pattern or configuration. For example, the cover (e.g., polyester taffeta fabric, etc.) may be selectively plated by applying (e.g., gravure printing, inkjet printing, etc.) an insulating ink (e.g., a silicone-based ink, etc.) on the cover, applying a catalyst coating (e.g., butadiene acrylonitrile and palladium, etc.) on the cover whereat the insulating ink is not present, and depositing (e.g., electrolessly depositing, etc.) a metal plating (e.g., copper and/or nickel, etc.) on the catalyst coating. Or, for example, the cover (e.g., polyester taffeta fabric, etc.) may be selectively plated by applying electrically-conductive ink (e.g., butadiene acrylonitrile with silver and/or palladium filler, etc.) on the cover, and depositing (e.g., electrolessly depositing, etc.) a metal plating (e.g., copper and/or nickel, etc.) on the electrically-conductive ink.

Also by way of example, the cover may comprise an electrically-conductive stretchable fabric or film, metal coated fabric-over-foam material, metal coated polyimide, metal coated polyphenylene sulfide, metal coated polyethylene terephthalate, metallized stretchable fabric (e.g., spandex, etc.), etc. By way of further example, the cover may comprise a non-conductive woven fabric plated with metal, where the fabric may be a non-conductive woven stretchable fabric, a non-conductive non-stretchable woven fabric, a non-conductive nonwoven stretchable fabric, or a non-conductive non-stretchable nonwoven fabric.

The contacts may comprise or be formed from a wide range of materials, such as composite materials, metalized polyethylene-wrapped foam, metalized polyimide-wrapped foam, metalized material, SMD or surface-mount contacts, metal spring contacts, etc. For example, the contacts may comprise metalized polyethylene wrapped about silicone or urethane foam. Or, for example, the contacts may comprise metalized polyimide (PI) film layered (e.g., via a sputtering process, etc.) with a combination of copper and tin (e.g., a polyimide film plated with about 56 percent copper and about 44 percent tin, a polyimide film plated with other percentages of copper and/or tin and/or other materials, etc.), where the polyimide film is wrapped about silicone or urethane foam. By way of further example, the contacts may comprise one or more L-C resonators that are configured to resonate at a resonant frequency and that are operable for virtually connecting to a ground plane, e.g., without using grounding vias or electrically-conductive grounding contacts, etc. Each L-C resonator may include an inductor and a capacitor.

As disclosed herein for exemplary embodiments, a shield may be installed (e.g., soldered, etc.) onto various rigid or flexible substrates. By way of example, a soft and/or flexible shield disclosed herein may be used with or on a rigid substrate. The softness and/or flexibility of the shield may help to inhibit or prevent the shield from peeling off, which might otherwise happen with a conventional rigid shield due to vibration or bending during manufacturing or while in use. As another example, a soft and/or flexible board-level shield disclosed herein may be used with or on a flexible substrate. In this latter example, the softness and/or flexibility of the shield may provide sufficient flexibility to allow the shield to bend or twist along with the flexible substrate.

In exemplary embodiments, a soft and/or flexible shield may be configured such that it can be surface mounted to a surface of a PCB. For example, electrically-conductive contacts of the soft and/or flexible shield may be surface mounted to the PCB for electrically coupling the shield's contacts to the PCB. In this example, the contacts may be placed on the surface of the PCB manually or via suitable pick and place equipment (e.g., a gripper, a pneumatic head, a vacuum pick-and-place head, a suction cup pick-and-place head, etc.). The contacts may be surface mounted (at a generally flat surface of the contacts) to the PCB via solder and a reflow soldering. Solder pads (e.g., a tin-lead, silver, gold, etc. plated copper pad, etc.) may be provided on the surface of the PCB (e.g., formed as part of the PCB, coupled to the PCB by suitable operations, etc.), and the shield's contacts may initially be coupled to the solder pads via solder paste provided on the solder pads. The PCB and the shield's contacts may then be subjected to a controlled heating process (e.g., in a reflow soldering oven of the reflow soldering operation, etc.) which melts the solder paste and permanently couples the shield's contacts to the PCB. During the reflow soldering operation, the shield's contacts and the PCB may be subjected to various temperatures ranging from about 20 degrees Celsius (room temperature) up to about 280 degrees Celsius. With that said, the components of the shield's contacts (e.g., resilient core member, electrically-conductive layer wrapped about the core member, adhesive used to attach the electrically-conductive layer to the core member, etc.) may be capable of withstanding solder reflow conditions and the temperatures (and temperature changes) associated therewith (e.g., temperatures up to at least about 280 degrees Celsius, etc.). As such, the shield's contacts may maintain their operational integrity in terms of structure (e.g., without a bond between the adhesive, the resilient core member, and the electrically-conductive layer failing; without the electrically-conductive layer opening or unwrapping; etc.), performance, etc. following the reflow soldering operation (e.g., the shield's contacts may be solder reflow proces sable, the shield's contacts may be reflow tunnel compatible, etc.).

With reference to the figures, FIG. 1 illustrates an exemplary embodiment of an EMI shield 100 according to aspects of the present disclosure. The EMI shield 100 is shown installed on a substrate 104 (e.g., a PCB, etc.). The shield 100 includes contacts or pillars 108 and a cover 112 attached (e.g., mechanically and electrically connected, etc.) to the contacts 108. The shield 100 is operable for shielding one or more components that may be provided on the substrate 104 in an interior or shielding space 116 cooperatively defined by the contacts 108 and the cover 112.

The cover 112 may be soft and/or flexible. For example, the cover 112 may be configured with sufficient flexibility such that the cover 112 is capable of being flexed, bent, or curved to a radius of curvature of 100 mm. Additionally, or alternatively, the cover 112 may comprise a straight/stretchable or curved segment. The cover 112 includes an electrically-conductive material or inner layer 120 and a non-conductive outer material or layer 124. The non-conductive outer layer 124 may provide support for the electrically-conductive layer 120.

The electrically-conductive layer 120 and non-conductive layer 124 of the cover 112 may comprise or be formed from a wide range of materials. For example, non-conductive layer 124 may comprise dielectric plastic (e.g., polyimide, polyphenylene sulfide, polyethylene terephthalate, etc.), and the electrically-conductive layer 120 may comprise a metal coating on the dielectric plastic. The metal coating may be provided by plating, sputtering, evaporation, adhesive, etc. Additional examples for the cover 112 include electrically-conductive stretchable fabric or film, metal coated fabric-over-foam material, metal coated polyimide, metal coated polyphenylene sulfide, metal coated polyethylene terephthalate, metallized stretchable fabric (e.g., spandex, etc.), etc. By way of further example, the cover 112 may comprise a non-conductive woven fabric plated with metal, where the fabric is a non-conductive woven stretchable fabric, a non-conductive non-stretchable woven fabric, a non-conductive nonwoven stretchable fabric, or a non-conductive non-stretchable nonwoven fabric.

The cover 112 may also include dielectric or non-conductive material along the inner surface of the electrically-conductive layer 120. The dielectric material may inhibit the electrically-conductive layer 120 from directly contacting and electrically shorting one or more components when the one or more components are under the shield 100.

Figure 7:
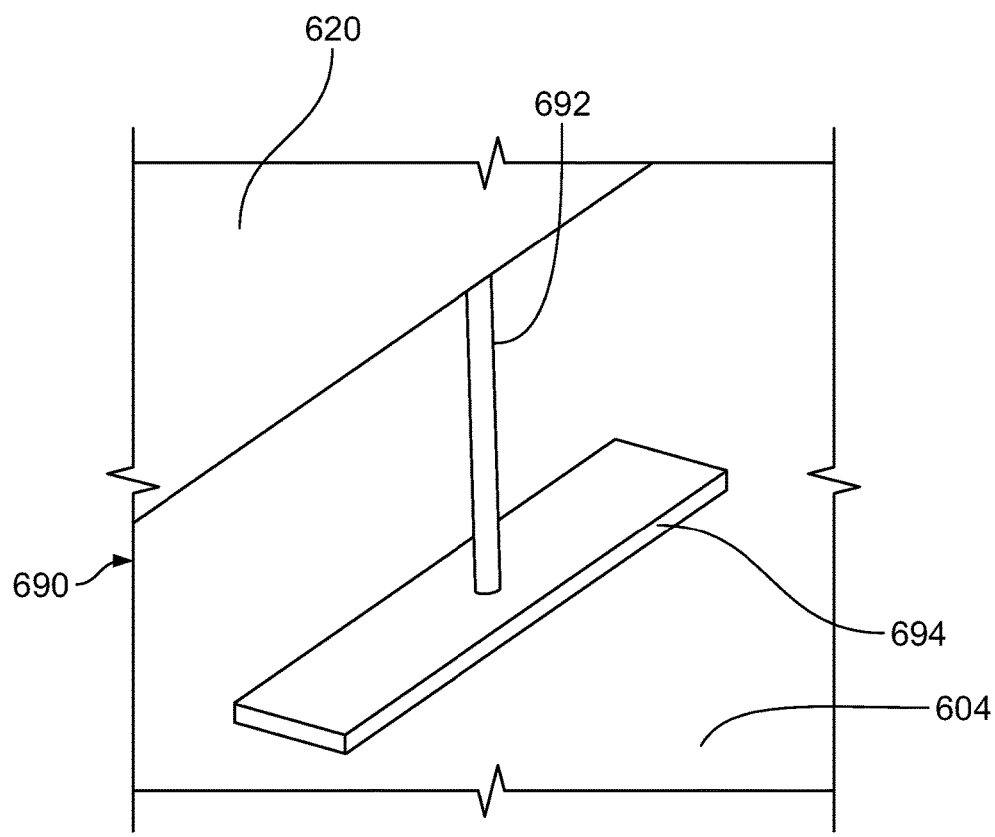
FIG. 7 is a perspective view of a portion of a soft and/or flexible board level shield and a L-C resonator according to an exemplary embodiment.

The contacts 108 may be soft and/or flexible in some exemplary embodiments. Alternatively, the contacts 108 may be rigid in other exemplary embodiments. In alternative exemplary embodiments, the contacts may comprise L-C resonators 690 as shown in FIG. 7.

With continued reference to FIG. 1, the contacts 108 may comprise or be formed from a wide range of materials, including the materials disclosed above and other suitable materials. By way of example, the contacts 108 may comprise SMD or surface-mount contacts and/or metal spring contacts, etc. The contacts 108 are sized to have a relatively small (e.g., minimum, etc.) footprint.

In the example embodiment shown in FIG. 1, the contacts 108 are close to the edges 128 of the cover 112. Alternative embodiments may include contacts 108 in other or additional locations relative to the cover 112 and/or may include more or less than five contacts along the edges 128 of the shield 100. Components on the substrate 104 may be positioned in various locations beneath the cover 112 and relative to the contacts 108 such that the components are provided with EMI shielding by virtue of the EMI shielding inhibiting the ingress and/or egress of EMI into and/or out of the space 116. In other exemplary embodiments, an EMI shield may include interior and exterior walls, dividers, and/or partitions that define two or more individual EMI shielding compartments. In which case, components on the substrate may be positioned in different compartments such that the components are provided with EMI shielding by virtue of the EMI shielding compartments inhibiting the ingress and/or egress of EMI into and/or out of each EMI shielding compartment.

Although FIG. 1 illustrates the shield 100 having a rectangular shape, other exemplary embodiments may include shields having different configurations (e.g., circular, curved, triangular, irregular, other non-rectangular shapes, etc.). In an example embodiment, the contacts 108 have a height of about two (2) millimeters, a length of about three (3) millimeters, and a width of about three (3) millimeters. In exemplary embodiments, the external overall height of the shield 100 with the cover 112 attached to the contacts 108 may range from about 0.5 mm to 5 mm (e.g., 0.5 millimeters, 1 mm, 5 mm, etc.). The dimensions provided in this application are for purpose of illustration only as other exemplary embodiments may have a different configuration, such as a different size (e.g., larger or smaller) and/or a different shape (e.g., non-rectangular, etc.), etc.

The cover 112 may be sized to match and/or to overhang (e.g., drape over, etc.) a perimeter defined by the outside dimensions of the contacts 108. Preferably, the cover 112 and its electrically-conductive layer 120 and non-conductive layer 124 overhang or drape over the perimeter defined by the outside dimensions of the contacts 108. By having the cover 112 drape over or overhang in this exemplary manner, gaps or spacing between the bottom edge of the cover 112 and the substrate 104 (e.g., PCB, etc.) may be reduced (e.g., minimized, eliminated, etc.) for frequency of operation.

The cover 112 may be attached to the contacts 108 in various ways depending on the materials used to make the shield 100 and/or method (e.g., surface mount technology, soldering, etc.) used to install the shield 100 on a PCB or other substrate. In some embodiments, the cover 112 may be secured to the contacts 108 by an adhesive, e.g., a high-temperature adhesive, epoxy, conductive pressure sensitive adhesive (CPSA), conductive hot melt adhesive, etc. Other or additional adhesives and/or methods could also be used to attach the cover 112 to contacts 108. In some embodiments, the cover 112 may be bonded to the contacts 108 by fused metal where the metal is fused by thermal energy (e.g., in a reflow process, etc.), by laser energy, etc.

In some example implementations, solder reflow may be used to join the contacts 108 with a PCB or other substrate before or after the cover 112 has been attached to the contacts 108. In some implementations, the cover 112 is not attached until after the contacts 108 have been attached to a substrate and electronic components have been installed on the substrate in an area to be shielded by the shield 100. In one example embodiment, the shield 100 may be soldered as a surface-mount device to a PCB or other substrate. Accordingly, the shield 100 may be compatible with surface mount technology (SMT). Other or additional methods may be used to attach the cover 112 to the contacts 108 and the contacts 108 to a substrate.

Figure 2:
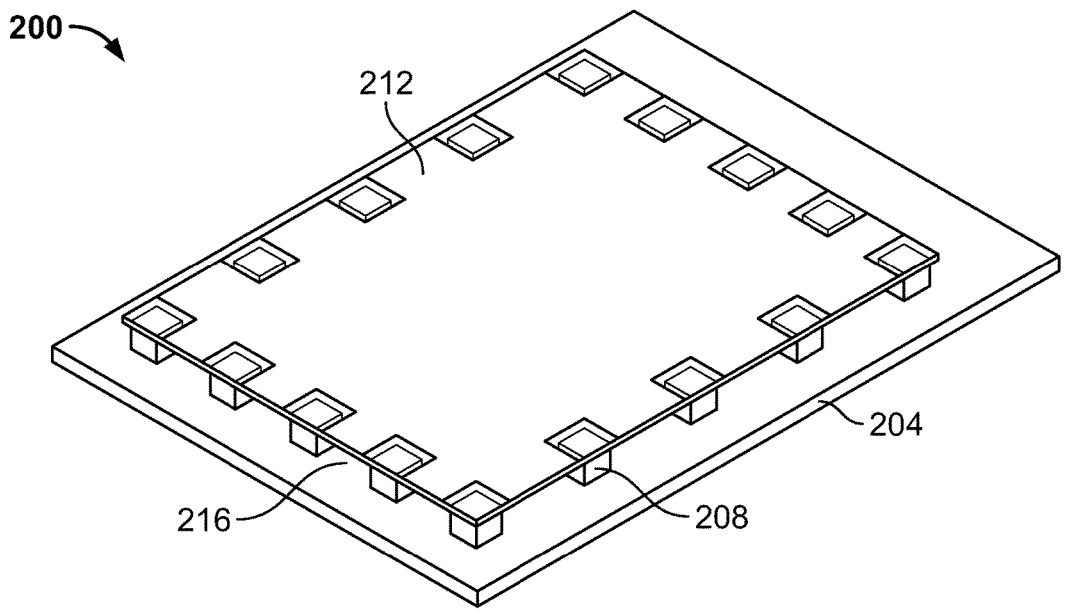
FIG. 2 is a perspective view of a soft and/or flexible board level shield according to an exemplary embodiment.
Figure 3:
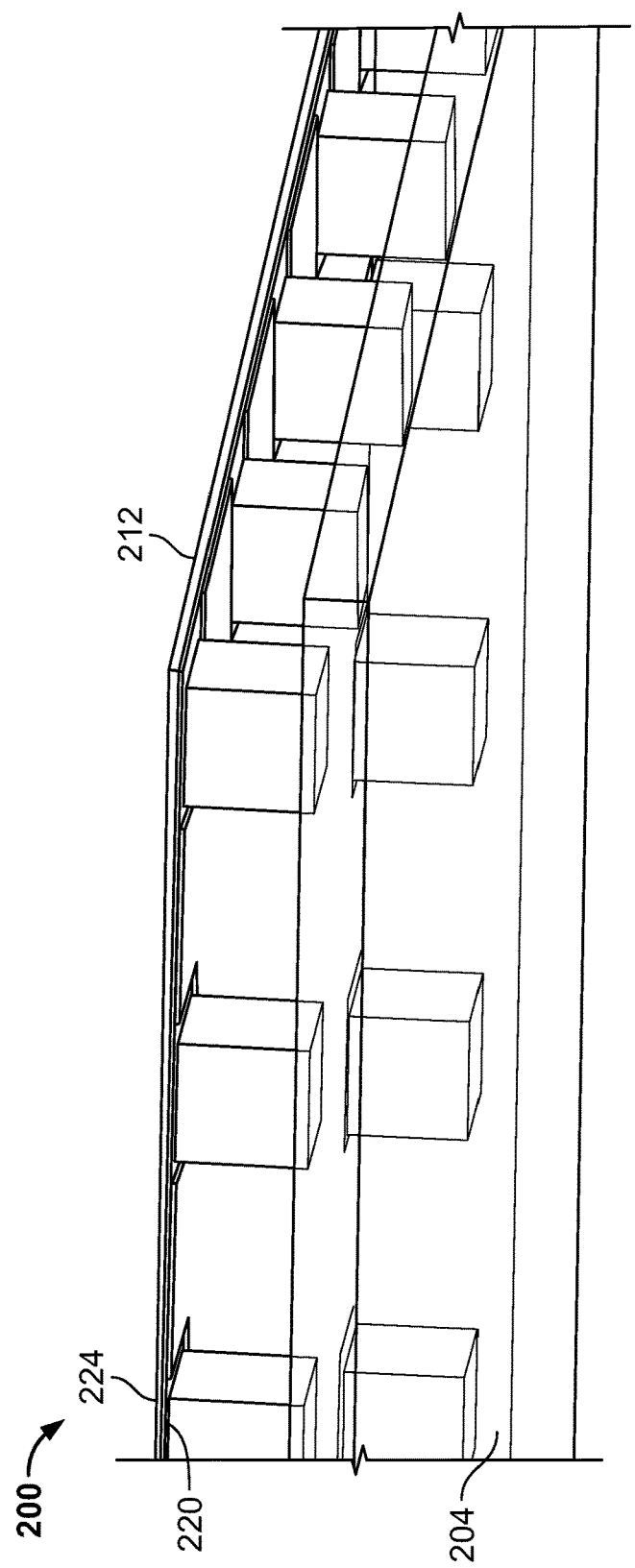
FIG. 3 is a lower perspective view of a portion of the soft and/or flexible board level shield shown in FIG. 2.
Figure 4:
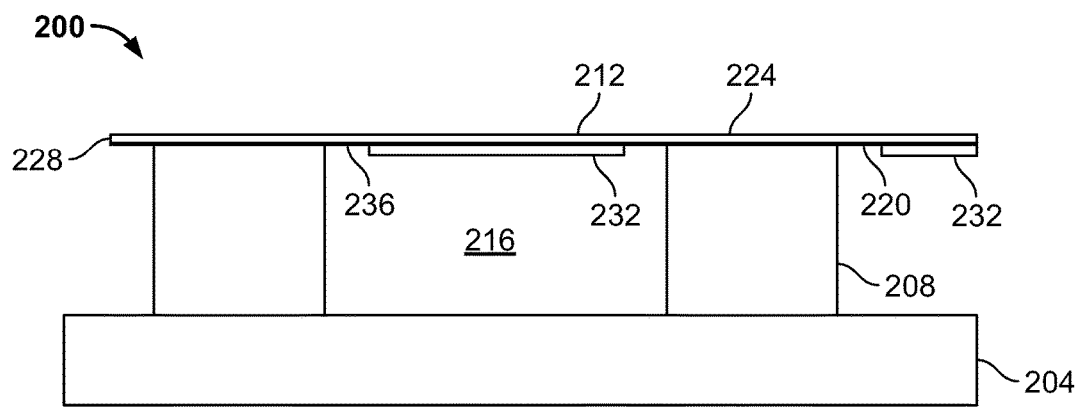
FIG. 4 is a cross-sectional view of a portion of the soft and/or flexible board level shield shown in FIG. 2.

FIGS. 2 through 4 illustrate another exemplary embodiment of an EMI shield 200 according to aspects of the present disclosure. The EMI shield 200 is shown installed on a substrate 204 (e.g., a PCB, etc.). The shield 200 includes contacts or pillars 208 and a cover 112 attached (e.g., mechanically and electrically connected, etc.) to the contacts 208. The shield 200 is operable for shielding one or more components that may be provided on the substrate 204 in an interior or shielding space 216 cooperatively defined by the contacts 208 and the cover 212.

The cover 212 may be soft and/or flexible. For example, the cover 212 may be configured with sufficient flexibility such that the cover 212 is capable of being flexed, bent, or curved to a radius of curvature of 100 mm. Additionally, or alternatively, the cover 212 may comprise a straight/stretchable or curved segment.

As shown in FIG. 4, the cover 212 includes an electrically-conductive material or inner layer 220 between a non-conductive material or outer layer 224 and a non-conductive material or inner layer 232. One or both of the non-conductive outer and inner layers 224, 232 may provide support for the conductive inner layer 220. The inner non-conductive layer 232 includes openings or slots 236 through which the electrically-conductive layer 220 of the cover 212 is mechanically and electrically connected to the contacts 208. The dielectric or non-conductive material 232 may inhibit the electrically-conductive layer 220 from directly contacting and electrically shorting one or more components when the one or more components are under the shield 200.

The electrically-conductive layer 220 and non-conductive layers 224, 232 of the cover 112 may comprise or be formed from a wide range of materials. For example, either or both of the non-conductive layers 224, 232 may comprise dielectric plastic (e.g., polyimide, polyphenylene sulfide, polyethylene terephthalate, etc.). The electrically-conductive layer 220 may comprise a metal coating on the dielectric plastic of the non-conductive layer 224. The metal coating may be provided by plating, sputtering, evaporation, adhesive, etc. The dielectric plastic of the non-conductive layer 232 may be adhesively attached to the metal coating of the electrically-conductive layer 220. Additional examples for the cover's non-conductive layer 224 and electrically-conductive layer 220 include electrically-conductive stretchable fabric or film, metal coated fabric-over-foam material, metal coated polyimide, metal coated polyphenylene sulfide, metal coated polyethylene terephthalate, metallized stretchable fabric (e.g., spandex, etc.), etc. By way of further example, the cover's non-conductive layer 224 and electrically-conductive layer 220 may comprise a non-conductive woven fabric plated with metal, where the fabric is a non-conductive woven stretchable fabric, a non-conductive non-stretchable woven fabric, a non-conductive nonwoven stretchable fabric, or a non-conductive non-stretchable nonwoven fabric. The cover's non-conductive layer 232 may comprise a non-conductive woven stretchable fabric, a non-conductive non-stretchable woven fabric, a non-conductive nonwoven stretchable fabric, or a non-conductive non-stretchable nonwoven fabric.

The contacts 208 may be soft and/or flexible in some exemplary embodiments. Alternatively, the contacts 208 may be rigid in other exemplary embodiments. The contacts 208 may comprise or be formed from a wide range of materials, including the materials disclosed above and other suitable materials. By way of example, the contacts 208 may comprise SMD or surface-mount contacts and/or metal spring contacts. The contacts 208 are preferably sized to have a relatively small (e.g., minimum, etc.) footprint.

In the illustrated example embodiment, the contacts 208 are close to edges 228 of the cover 212. Alternative embodiments may include contacts 208 in other or additional locations relative to the cover 212 and/or may include more or less than five contacts along the edges 228 of the shield 200. Components on the substrate 204 may be positioned in various locations beneath the cover 212 and relative to contacts 208 such that the components are provided with EMI shielding by virtue of the EMI shielding inhibiting the ingress and/or egress of EMI into and/or out of the space 216. In other exemplary embodiments, an EMI shield may include interior and exterior walls, dividers, and/or partitions that define two or more individual EMI shielding compartments. In which case, components on the substrate may be positioned in different compartments such that the components are provided with EMI shielding by virtue of the EMI shielding compartments inhibiting the ingress and/or egress of EMI into and/or out of each EMI shielding compartment.

Although FIGS. 2, 3, and 4 illustrate the shield 200 having a rectangular shape, other exemplary embodiments may include shields having different configurations (e.g., circular, curved, triangular, irregular, other non-rectangular shapes, etc.). In one example embodiment, the contacts 208 have a height of about two (2) millimeters, a length of about three (3) millimeters, and a width of about three (3) millimeters. In exemplary embodiments, the external overall height of the shield 100 with the cover 112 attached to the contacts 108 may range from about 0.5 mm to 5 mm (e.g., 0.5 millimeters, 1 mm, 5 mm, etc.). The dimensions provided in this application are for purpose of illustration only as other exemplary embodiments may have a different configuration, such as a different size (e.g., larger or smaller) and/or a different shape (e.g., non-rectangular, etc.), etc.

The cover 212 may be sized to match and/or to overhang (e.g., drape over, etc.) a perimeter defined by the outside dimensions of the contacts 208. Preferably, the cover 212 and its electrically-conductive layer 220 and non-conductive layer 224 overhang or drape over the perimeter defined by the outside dimensions of the contacts 208. By having the cover 212 drape over or overhang in this exemplary manner, gaps or spacing between the bottom edge of the cover 212 and the substrate 204 (e.g., PCB, etc.) may be reduced (e.g., minimized, eliminated, etc.) for frequency of operation.

The cover 212 may be attached to the contacts 208 in various ways depending on the materials used to make the shield 200 and/or method (e.g., surface mount technology, soldering, etc.) used to install the shield 200 on a PCB or other substrate. In some embodiments, the cover 212 may be secured to the contacts 208 by an adhesive, e.g., a high-temperature adhesive, epoxy, CPSA, conductive hot melt adhesive, etc. Other or additional adhesives and/or methods could be used to attach the cover 212 to contacts 208. In some embodiments, the cover 212 may be bonded to the contacts 208 by fused metal where the metal is fused by thermal energy (e.g., in a reflow process, etc.), by laser energy, etc.

In some example implementations, solder reflow may be used to join the contacts 208 with a PCB or other substrate before or after the cover 212 has been attached to the contacts 208. In some implementations, the cover 212 is not attached until after the contacts 208 have been attached to the substrate 204 and components have been installed on the substrate 204 in an area to be shielded by the shield 200. In various embodiments, the shield 200 may be soldered as a surface-mount device to a PCB or other substrate. Accordingly, the shield 200 may be compatible with surface mount technology (SMT). Other or additional methods may be used to attach the cover 212 to the contacts 208 and the contacts 208 to a substrate.

Figure 5:
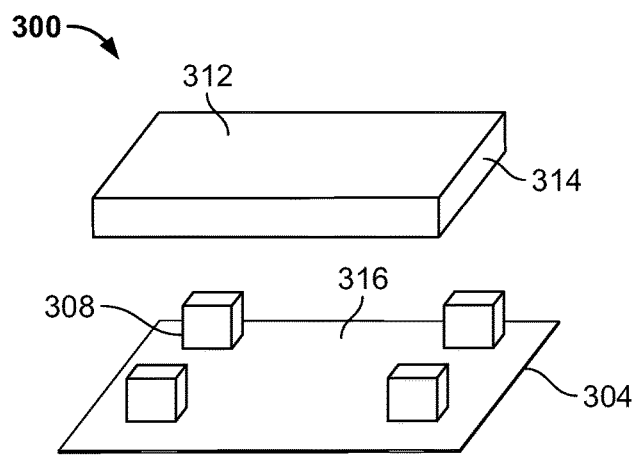
FIG. 5 is an exploded perspective view of a soft and/or flexible board level shield according to an exemplary embodiment and showing the shield's cover or lid aligned over the shield's contacts.
Figure 6:
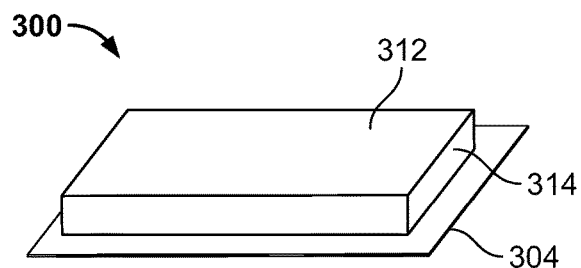
FIG. 6 is a perspective view of the soft and/or flexible board level shield shown in FIG. 5 with the cover or lid now coupled to and/or positioned over the shield's contacts.

FIGS. 5 and 6 illustrate another exemplary embodiment of an EMI shield 300 according to aspects of the present disclosure. The EMI shield includes one or more contacts or pillars 308 and a cover or lid 312. As shown in FIG. 5, the contacts 308 are installed on a substrate 304 (e.g., a PCB, etc.).

The cover 312 may be soft and/or flexible. For example, the cover 312 may be configured with sufficient flexibility such that the cover 312 is capable of being flexed, bent, twisted, or curved to a radius of curvature of 100 mm. Additionally, or alternatively, the cover 312 may comprise a straight/stretchable or curved segment.

Sidewalls 314 depend from (e.g., are attached to, integrally connected with, installed to, extend downwardly from, etc.) the cover 312. In some embodiments, the sidewalls 314 may define a skirt generally around the cover 312. When the cover 312 is positioned over and/or coupled to the contacts 308 as shown in FIG. 6, the shield 300 is operable for shielding one or more components that may be provided on the substrate 304 within an interior or shielding enclosure cooperatively defined by the sidewalls 314 and the cover 312. Alternative embodiments may include more or less than four sidewalls or no sidewalls. Where the substrate 304 is flexible, the shield 300 may be have sufficient flexibility to twist or bend along with substrate 304, e.g., to a radius of curvature of 100 mm, etc.

In some embodiments, the bottom edge(s) of one or more of the sidewalls 314 may be directly attached to the substrate 304, e.g., by adhesive, etc. In other embodiments, the one or more sidewalls 314 are not directly attached to and remain unattached from the substrate 304.

The exterior or outer surface of the cover 312 may be electrically conductive. The interior or inner surface of the cover 312 may be non-conductive. In this example, the sidewalls 314 may be configured to electrically contact the posts or contacts 308 (e.g., at the four corners of the shield 300, etc.) for establishing grounding contact between the cover 312 and the contacts 308.

In the illustrated embodiment, the shield 300 does not include any interior walls, dividers, or partitions. Thus, the sidewalls 314 and cover 312 of the EMI shield 300 generally define a single interior compartment or space 316. In other exemplary embodiments, an EMI shield may include interior and exterior walls, dividers, and/or partitions that define two or more individual EMI shielding compartments. In which case, components on the substrate may be positioned in different compartments such that the components are provided with EMI shielding by virtue of the EMI shielding compartments inhibiting the ingress and/or egress of EMI into and/or out of each EMI shielding compartment.

Although the example shield 300 has a generally rectangular shape, other exemplary embodiments may include shields having different configurations (e.g., circular, curved, triangular, irregular, other non-rectangular shapes, etc.). In exemplary embodiments, the external overall height of the shield 300 with the cover 312 attached to the contacts 308 may range from about 0.5 mm to 5 mm (e.g., 0.5 millimeters, 1 mm, 5 mm, etc.). The dimensions provided in this application are for purpose of illustration only as other exemplary embodiments may have a different configuration, such as a different size (e.g., larger or smaller) and/or a different shape (e.g., non-rectangular, etc.), etc.

In various embodiments, the cover 312 and sidewalls 314 may be formed together as a single piece, separately as separate pieces, from different materials, from the same material. For example, the cover 312 and sidewalls 314 may be formed together from a single piece of resiliently stretchable electrically-conductive fabric and/or electrically-conductive film.

The cover 312 and sidewalls 314 may comprise or be formed from a wide range of materials. For example, either or both of the cover 312 and sidewalls 314 may comprise dielectric plastic (e.g., polyimide, polyphenylene sulfide, polyethylene terephthalate, etc.) and a metal coating on the dielectric plastic provided by plating, sputtering, evaporation, adhesive, etc. Additional examples for the cover 312 and/or sidewalls 314 include electrically-conductive stretchable fabric or film, metal coated fabric-over-foam material, metal coated polyimide, metal coated polyphenylene sulfide, metal coated polyethylene terephthalate, metallized stretchable fabric (e.g., spandex, etc.), etc. By way of further example, the cover 312 and/or sidewalls 314 may comprise a non-conductive woven fabric plated with metal, where the fabric is a non-conductive woven stretchable fabric, a non-conductive non-stretchable woven fabric, a non-conductive nonwoven stretchable fabric, or a non-conductive non-stretchable nonwoven fabric.

The contacts 308 may be soft and/or flexible in some exemplary embodiments. Alternatively, the contacts 308 may be rigid in other exemplary embodiments. The contacts 308 may comprise or be formed from a wide range of materials, including the materials disclosed above and other suitable materials. By way of example, the contacts 308 may comprise SMD or surface-mount contacts and/or metal spring contacts. The contacts 308 are preferably sized to have a relatively small (e.g., minimum, etc.) footprint.

The contacts 308 may be attached (e.g., soldered, etc.) onto the substrate 304, whereby the contacts 308 may thus be operable as bosses or protruding features for holding the cover 312 a spaced distance above the substrate 304. By way of example, the cover 312 may be attached to the soldered contacts 308 as follows. The cover 312 and sidewalls 314 may be sized to fit over the contacts 308 with or without overlapping the outside dimensions of the contacts 308. The cover 312 may be attached to the contacts 308 in various ways depending on the materials used to make the shield 300 and/or method (e.g., surface mount technology, soldering, etc.) used to install the shield 300 on a PCB or other substrate. In some embodiments, the cover 312 may be secured to the contacts 308 by an adhesive, e.g., a high-temperature adhesive, epoxy, conductive pressure sensitive adhesive (CPSA), conductive hot melt adhesive, etc. Other or additional adhesives and/or methods could also be used to attach the cover 312 to contacts 308. In some embodiments, the cover 112 may be bonded to the contacts 108 by fused metal where the metal is fused by thermal energy (e.g., in a reflow process, etc.), by laser energy, etc.

In some example implementations, solder reflow may be used to join the contacts 308 with a PCB or other substrate before or after the cover 312 has been attached to the contacts 308. In some implementations, the cover 312 is not attached until after the contacts 308 have been attached to a substrate and components have been installed on the substrate in an area to be shielded by the shield 300. In one example embodiment, the shield 300 may be soldered as a surface-mount device to a PCB or other substrate. Accordingly, the shield 300 may be compatible with surface mount technology (SMT). Other methods may be used to attach the cover 312 to the contacts 308 and the contacts 308 to a substrate.

In the illustrated example embodiment, the contacts 308 are close to the sidewalls 314 of the cover 312. Alternative embodiments may include more or less than four contacts 308 and/or one or more contacts 308 in other or additional locations relative to the cover 312, sidewalls 314, and/or substrate 304.

In exemplary embodiments, a cover (e.g., cover 112 (FIG. 1), cover 212 (FIGS. 2-4), cover 312 (FIGS. 5 and 6), cover 620 (FIG. 6), cover 720 (FIG. 9), etc.) disclosed herein may be used with one or more L-C resonators. The one or more L-C resonators may be configured to resonate at a resonant frequency (e.g., about 2.75 GHz, about 4 GHz, etc.). The one or more L-C resonators may be operable for virtually connecting a cover to a ground plane, e.g., without using grounding vias, etc. For example, the cover may be positioned along a first side of a printed circuit board (PCB) and virtually connected via the one or more L-C resonators to a ground plane along the second side of the PCB without any physical electrical connection directly between the cover and the ground plane.

Each L-C resonator may include an inductor and a capacitor. By way of example, the inductor may comprise an inductive pin, such as an electrically-conductive (e.g., metal, etc.) pin having a rectangular or circular cross section, etc. By way of further example, the capacitor may comprise a capacitive patch element, such as a generally rectangular electrically-conductive (e.g., metal, etc.) patch element. Alternatively, the L-C resonators may comprise differently configured inductors and capacitors, e.g., made of different materials, having different shapes (e.g., non-circular, non-rectangular, etc.).

For example, FIG. 7 illustrates a portion of a cover 620 and an L-C resonator 690 coupled (e.g., adhesively attached, etc.) to the cover 620. The L-C resonator 690 may be configured to resonate at a resonant frequency (e.g., about 2.75 GHz, about 4 GHz, etc.). In exemplary embodiments, a sufficient number of L-C resonators 690 are coupled to the cover 620 to provide or define a virtual ground fence or frame (VGF) that allows the cover 620 to be virtually connectible to a ground plane underneath or along an opposite side of a PCB 604 (broadly, a substrate) without any physical electrical connection directly between the cover 620 and the ground plane. For example, the cover 620 may be virtually connected to the ground plane without using grounding vias, plated thru holes, or other intervening physical components to create a physically existing electrical pathway from the cover 620 to the ground plane.

The one or more L-C resonators 690 may be coupled to the cover 620 by an adhesive, e.g., a high-temperature adhesive, epoxy, electrically-conductive pressure sensitive adhesive (CPSA), electrically-conductive hot melt adhesive, etc. Other or additional adhesives and/or methods could also be used to attach an L-C resonator to a cover. In some other exemplary embodiments, an L-C resonator may be bonded to a cover by fused metal where the metal is fused by thermal energy (e.g., in a reflow process, etc.), by laser energy, etc.

The one or more L-C resonators 690 may be placed at predetermined locations and spaced apart from each other along the cover 620 to provide or accommodate acceptable virtual grounding at their resonance frequency (e.g., about 2.75 GHz, etc.). In an exemplary embodiment, three L-C resonators 690 may be equally spaced apart from each other along each corresponding side or edge of the cover 620. The number, shape, and size of L-C resonators and their locations along the cover may depend on the configuration (e.g., shape, size, etc.) of the cover and/or the particular end use intended for the EMI shield (e.g., BLS, etc.) that includes the cover and L-C resonators. The number of L-C resonators may be increased depending on the value of the required shielding effectiveness at the resonance frequency. Different L-C resonator dimensions can also be used to spread the resonance frequencies in a wide range to achieve a wide band solution.

As shown in FIG. 7, the L-C resonator 690 includes an inductor 692 and a capacitor 694. The inductor 692 may comprise an elongate linear inductive element, such as an inductive pin having a rectangular or circular cross section, etc. The capacitor 694 may comprise a capacitive patch element, such as a generally rectangular electrically-conductive patch element, etc. The inductor 692 and capacitor 694 may be made of stainless steel, although other electrically-conductive materials may also be used (e.g., other metals, non-metals, etc.). The capacitors 694 may be fabricated directly on the PCB substrate 604, and the inductors 692 may be soldered to the capacitors 694. Alternatively, the capacitors 694 may be formed by other manufacturing processes, such as stamping, etc. Likewise, the inductors 692 may be coupled to the capacitors 694 using other means besides solder, such as electrically-conductive adhesives, etc.

The inductor 692 is coupled to the capacitor 694 such that the capacitor 694 is generally perpendicular to the inductor 692. In addition, the capacitor 694 may be configured to contact (e.g., abut against, be flush against, rest upon, etc.) the substrate 604 when the cover 620 and L-C resonator 690 are installed to the substrate 604. Alternatively, the L-C resonators may comprise inductors and/or capacitors that have a different configuration, such as having different shapes (e.g., non-circular cross-section, non-rectangular shape, etc.) and/or being made of different materials, etc. For example, the inductive pins (broadly, inductors) may have any cross-section shape as long as the inductive pins are inductive enough to establish the resonance frequency at the correct or predetermined location with the aid of the capacitive patches (broadly, capacitors).

Figure 8:
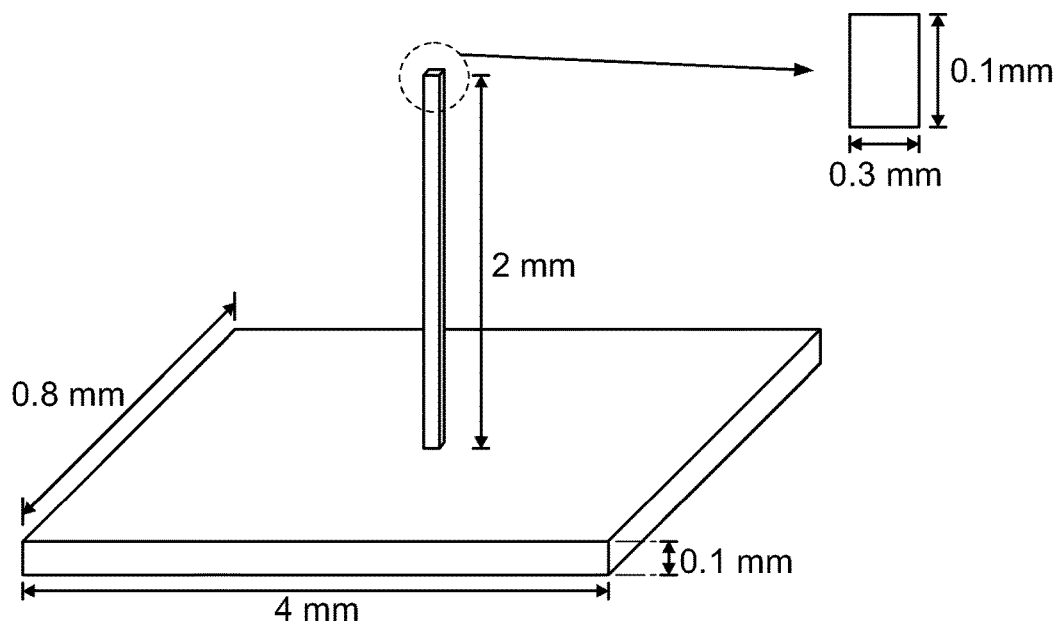
FIG. 8 is a perspective view of the example L-C resonator shown in FIG. 7, where dimensions in millimeters are provided for the inductor and capacitor for purpose of example only.

FIG. 8 provides exemplary dimensions for an L-C resonator (e.g., 690 in FIG. 7, etc.) that may be used in exemplary embodiments disclosed herein. As shown in FIG. 8, the inductor of the L-C-resonator has a height of 2 mm and a rectangular cross-section having a width of 0.3 mm and a length of 0.1 mm. The capacitor of the L-C-resonator has a thickness of 0.1 mm and a rectangular shape having a width of 4 mm and a length of 0.8 mm. The dimensions and shapes provided in this paragraph and FIG. 8 are for purposes of illustration only as an L-C resonator(s) in other exemplary embodiments may have a different configuration, such as a different size (e.g., larger or smaller) and/or a different shape (e.g., non-rectangular, etc.), etc. For example, the number of resonators may be increased depending on the value of the required shielding effectiveness at the resonance frequency. Different resonator dimensions can also be used to spread the resonance frequencies in a wide range to achieve a wide band solution. The resonance frequency ($f_r$) can be determined by the equation below in which L is inductance a C is capacitance. A longer pin (broadly, inductor) will have a higher inductance than a shorter pin.

$$f_r = \frac{1}{2\pi\sqrt{LC}}$$

A larger pad area (broadly, capacitor) will have a higher capacitance than a smaller large pad area. It is common for board level shields to have a height of less than 1 mm. With such shields, the inductive pins are also relatively short with a small inductance. The small inductance associated with the short inductive pins can be compensated by large capacitive pads. Additionally, or alternatively, the inductors may be non-linear (e.g., inductors 792 shown in FIG. 9, etc.) to thereby increase their length without having to increase the height of the board level shield.

Figure 9:
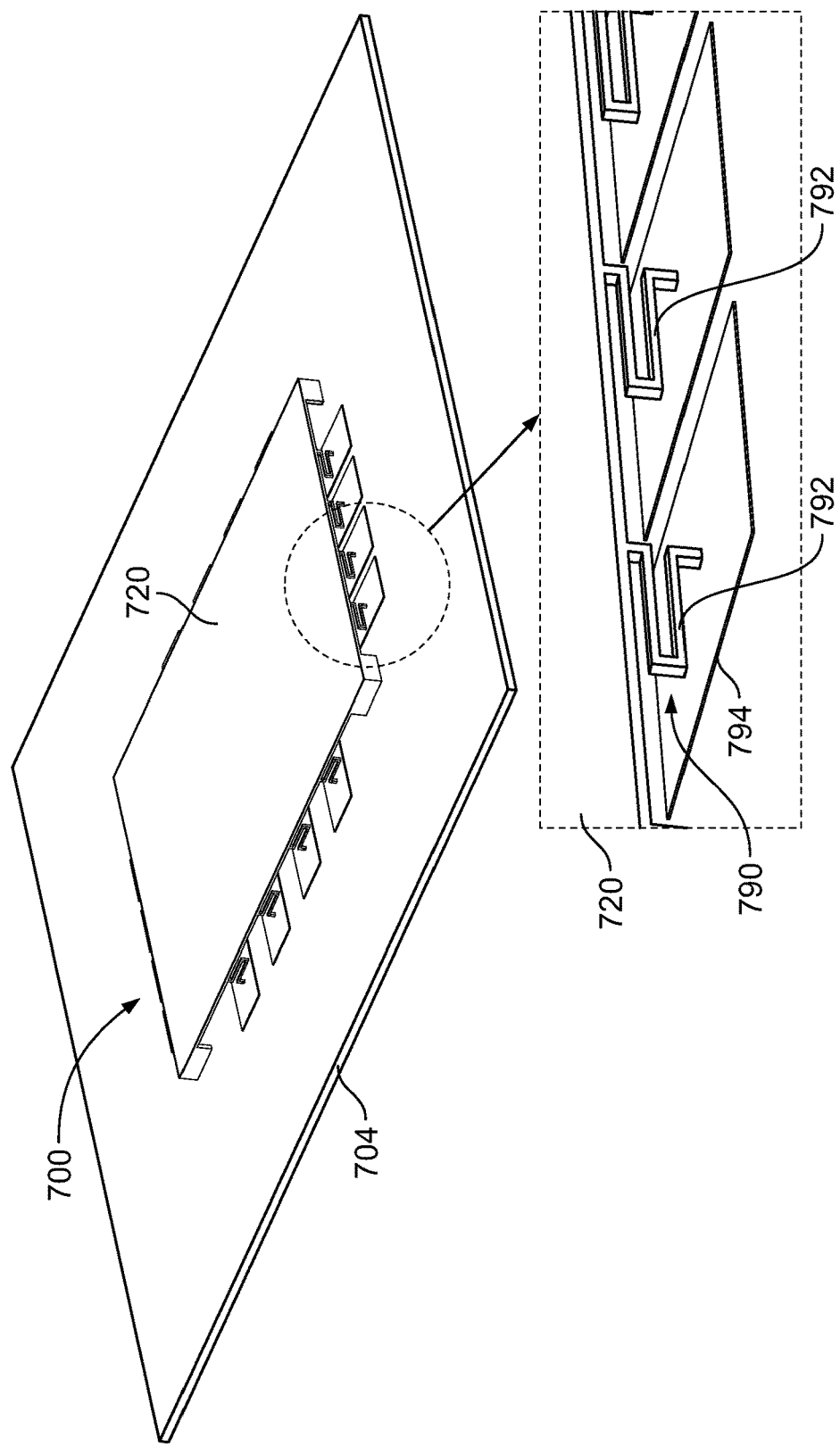
FIG. 9 is a perspective view of a soft and/or flexible board level shield including L-C resonators according to an exemplary embodiment.

FIG. 9 illustrates an exemplary embodiment of a board level shield (BLS) 700 according to aspects of the present disclosure. As shown, the BLS 700 is installed on a substrate 704 (e.g., a PCB, etc.). The BLS 700 includes L-C resonators 790 and a cover 720 attached (e.g., mechanically and electrically connected, etc.) to the L-C resonators 790. The shield 700 is operable for shielding one or more components that may be provided on the substrate 704 in an interior or shielding space cooperatively defined by the L-C resonators 790 and cover 720.

The cover 720 may be soft and/or flexible as disclosed above for covers 112, 212, and 312. For example, the cover 720 may be configured with sufficient flexibility such that the cover 720 is capable of being flexed, bent, or curved to a radius of curvature of 100 mm. Additionally, or alternatively, the cover 720 may comprise a straight/stretchable or curved segment.

The L-C resonators 790 are operable for virtually connecting the cover 720 to a ground plane, e.g., without using grounding pins or vias, etc. For example, the cover may be positioned along the first side of the printed circuit board (PCB) 704 (broadly, a substrate) and virtually connected via the L-C resonators 790 to a ground plane along the second side of the PCB 704 without any physical electrical connection directly between the cover 720 and the ground plane.

Each L-C resonator 790 includes an inductor 792 and a capacitor 794. The inductor 792 is non-linear in this example. The inductor 720 may comprise an inductive pin, such as an electrically-conductive (e.g., metal, etc.) pin having a rectangular or circular cross section, etc. By way of further example, the capacitor 794 may comprise a capacitive patch element, such as a generally rectangular electrically-conductive (e.g., metal, etc.) patch element. The inductor 792 and capacitor 794 may be made of stainless steel, although other electrically-conductive materials may also be used (e.g., other metals, non-metals, etc.). The capacitors 794 may be fabricated directly on the PCB 704. For example, the capacitors 794 may comprise capacitive pads incorporated on a top layer of a multilayer PCB (e.g., 4 layer FR4 PCB, etc.). The inductors 792 may be soldered to the capacitors 794. Alternatively, the capacitors 794 may be formed by other manufacturing processes, such as stamping, etc. Likewise, the inductors 792 may be coupled to the capacitors 794 using other means besides solder, such as electrically-conductive adhesives, etc. The L-C resonators 790 may comprise differently configured inductors and capacitors, e.g., made of different materials, having different shapes (e.g., non-circular, non-rectangular, etc.).

The L-C resonators 790 may be coupled to the cover 720 by an adhesive, e.g., a high-temperature adhesive, epoxy, electrically-conductive pressure sensitive adhesive (CPSA), electrically-conductive hot melt adhesive, etc. Other or additional adhesives and/or methods could also be used to attach an L-C resonator to a cover. In some other exemplary embodiments, an L-C resonator may be bonded to a cover by fused metal where the metal is fused by thermal energy (e.g., in a reflow process, etc.), by laser energy, etc.

The L-C resonators 790 may be placed at predetermined locations and spaced apart from each other along the cover 720 to provide or accommodate acceptable virtual grounding at their resonance frequency (e.g., about 2.75 GHz, etc.). In the exemplary embodiment shown in FIG. 9, four L-C resonators 790 are equally spaced apart from each other along each corresponding side or edge of the cover 720. The number, shape, and size of L-C resonators 790 and their locations along the cover 720 may depend on the configuration (e.g., shape, size, etc.) of the cover 720 and/or the particular end use intended for the BLS 700. The number of L-C resonators may be increased depending on the value of the required shielding effectiveness at the resonance frequency. Different L-C resonator dimensions can also be used to spread the resonance frequencies in a wide range to achieve a wide band solution.

Also disclosed are exemplary embodiments of methods relating to providing shielding for one or more components on a substrate. In an exemplary embodiment, a method generally includes installing one or more soft and/or flexible electrically-conductive contacts on a substrate, and installing a soft and/or flexible cover on the contact(s). The contact(s) may be installed on the substrate by soldering.

In some exemplary embodiments, a method relating to providing shielding for one or more components on a substrate generally includes soldering one or more soft and/or flexible electrically-conductive contacts and bonding a soft and/or flexible cover onto the contact(s). The contact(s) may operable as boss(es) or protruding feature(s) for holding the cover a spaced distance above the substrate.

Exemplary embodiments disclosed herein may provide one or more (but not necessarily any or all) of the following advantages over some existing board level EMI shields. For example, exemplary embodiments disclosed herein may be flexible and/or soft compared to conventional shielding made (e.g., of rigid materials such as metal, etc.) and may exhibit the same or similar shielding effectiveness as rigid metal board-level shields. By way of example, a soft and/or flexible shield disclosed herein may be used with or on a rigid substrate. The softness and/or flexibility of the shield may help to inhibit or prevent the shield from peeling off the rigid substrate when subjected to vibration or bending, e.g., during manufacture or use. In contrast, a convention rigid shield may have peel off from a substrate when subjected to vibration or bending. As another example, a soft and/or flexible board-level shield disclosed herein may be used with or on a flexible substrate. In this latter example, the softness and/or flexibility of the shield may provide sufficient flexibility to allow the shield to bend or twist along with the flexible substrate. Thus, the soft and/or flexible board-level shield may continue to provide effective shielding when the shield is bent and/or twisted along with a flexible substrate on which the shield is installed. Accordingly, exemplary embodiments disclosed herein are operable for providing shielding without imparting rigid constraints on the PCB substrates. The softness and/or flexibility of a shield disclosed herein may also allow for different 3D geometries and allow a substrate to change dimension (e.g., due to thermal mismatch, etc.) without generating too high a level of stress on solder joints. The softness and/or flexibility of a shield disclosed herein may also be useful for wearable electronic devices and allow for reduced crinkling of the top surface of the shield during use. In some exemplary embodiments that include L-C resonators, the shield may require less PCB space by reducing area occupied by guard traces, and costs may be reduced by eliminating the need for ground pins or vias.

In addition, the materials and dimensions provided herein are for purposes of illustration only, as the shields (e.g., 100, 200, 300, 700, etc.) may be made from different materials and/or have different dimensions depending, for example, on the particular application, such as the electrical components to be shielded, space considerations within the overall electronic device, EMI shielding and heat dissipation needs, and other factors.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A shield suitable for use in providing electromagnetic interference (EMI) shielding for one or more components on a substrate, the shield comprising:
    one or more contacts configured for installation on the substrate; and
    a soft and/or flexible electrically-conductive cover configured for installation on the one or more contacts, wherein the cover comprises a stretchable woven or non-woven fabric configured to allow the cover to bend or flex along with the substrate and/or the cover is capable of having a radius of curvature of 100 millimeters.

2. A shield suitable for use in providing electromagnetic interference (EMI) shielding for one or more components on a substrate, the shield comprising:
    one or more contacts configured for installation on the substrate; and
    a soft and/or flexible electrically-conductive cover configured for installation on the one or more contacts, wherein the cover comprises a fabric configured to allow the cover to bend or flex along with the substrate and/or the cover is capable of having a radius of curvature of 100 millimeters;
    wherein the one or more contacts comprise one or more resonators coupled to the cover that are configured to be operable for virtually connecting the cover to a ground plane without any intervening physical components that create a physically existing electrical pathway directly between the ground plane and the cover.

3. A shield suitable for use in providing electromagnetic interference (EMI) shielding for one or more components on a substrate, the shield comprising:
    one or more contacts configured for installation on the substrate; and
    a soft and/or flexible electrically-conductive cover configured for installation on the one or more contacts, wherein the cover comprises a fabric configured to allow the cover to bend or flex along with the substrate and/or the cover is capable of having a radius of curvature of 100 millimeters;

wherein each of the one or more contacts includes an L-C resonator comprising an inductor and a capacitor configured to be operable for virtually connecting the cover to a ground plane.

4. The shield of claim 3, wherein:
the inductor is attached to the cover; and
the capacitor is configured to be attached to the substrate.

5. The shield of claim 3, wherein:
the inductor is an inductive pin; and
the capacitor is a capacitive patch.

6. The shield of claim 1, wherein:
the one or more contacts comprise one or more metal spring contacts; and
the one or more contacts are solderable onto the substrate.

7. The shield of claim 1, wherein:
the one or more contacts are soldered as one or more bosses onto the substrate; and
the cover is bonded onto the one or more bosses.

8. The shield of claim 1, wherein:
the cover overhangs or drapes over a perimeter defined by outside dimensions of the contacts when the cover is connected to the one or more contacts; or
the shield further comprises one or more sidewalls depending from the cover that are configured to electrically contact the one or more contacts for establishing grounding contact between the cover and the one or more contacts.

9. The shield of claim 1, wherein:
the cover comprises an electrically-conductive layer between inner and outer non-conductive layers, the inner non-conductive layer having openings through which the electrically-conductive layer is connected with the one or more contacts; and
the inner non-conductive layer inhibits the electrically-conductive layer from directly contacting and electrically shorting one or more components when the one or more components are under the shield.

10. The shield of claim 1, wherein the stretchable woven or non-woven fabric of the cover comprises a metallized or metal plated stretchable woven fabric.

11. The shield of claim 2, wherein each of the one or more resonators includes an L-C resonator comprising an inductor and a capacitor.

12. The shield of claim 11, wherein:
the inductor is attached to the cover; and
the capacitor is configured to be attached to the substrate.

13. The shield of claim 11, wherein:
the inductor is an inductive pin; and
the capacitor is a capacitive patch.

14. The shield of claim 2, wherein the cover comprises a metallized or metal plated stretchable fabric.

15. A method relating to providing shielding for one or more components on a substrate using the shield of claim 1, the method comprising:
Installing the one or more contacts on the substrate; and
installing the soft and/or flexible cover on the one or more contacts.

16. The method of claim 15, wherein:
the substrate is flexible; and
the one or more electrically-conductive contacts comprise one or more of an SMD or surface-mount contact and/or metal spring contact; and
the cover comprises a metallized or metal plated stretchable fabric.

17. The method of claim 15, wherein:
installing the one or more electrically-conductive contacts comprises soldering the one or more electrically-conductive contacts onto the substrate; and
installing the cover comprises:
positioning an electrically-conductive layer of the cover onto the one or more electrically-conductive contacts through one or more openings in a non-conductive inner layer of the cover; and/or
positioning the cover relative to the one or more electrically-conductive contacts such that the cover overhangs or drapes over a perimeter defined by outside dimensions of the one or more electrically-conductive contacts.

18. The method of claim 15, wherein the electrically-conductive contacts comprise one or more resonators configured to be operable for virtually connecting the cover to a ground plane without any physical electrical connection directly between the ground plane and the cover.

19. The method of claim 18, wherein each of the one or more resonators includes an L-C resonator comprising an inductor and a capacitor.

* * * * *